United States Patent
Fukushi et al.

(10) Patent No.: US 10,361,535 B2
(45) Date of Patent: Jul. 23, 2019

(54) SEMICONDUCTOR LASER DRIVING CIRCUIT

(71) Applicant: SHIMADZU CORPORATION, Nishinokyo-Kuwabaracho, Nakagyo-ku, Kyoto-shi, Kyoto (JP)

(72) Inventors: Ichiro Fukushi, Kyoto (JP); Akiyuki Kadoya, Kyoto (JP); Kazuma Watanabe, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 16/031,692

(22) Filed: Jul. 10, 2018

(65) Prior Publication Data
US 2019/0027893 A1 Jan. 24, 2019

(30) Foreign Application Priority Data
Jul. 19, 2017 (JP) .................. 2017-139633

(51) Int. Cl.
H01S 5/042 (2006.01)
H01S 5/068 (2006.01)
(Continued)

(52) U.S. Cl.
CPC .......... H01S 5/0427 (2013.01); H01S 5/0261 (2013.01); H01S 5/0428 (2013.01);
(Continued)

(58) Field of Classification Search
CPC .. H01S 5/0427; H01S 5/0428; H01S 5/06203; H01S 5/06808; H01S 5/0261; H01S 5/06835
See application file for complete search history.

(56) References Cited

U.S. PATENT DOCUMENTS

2007/0104232 A1* 5/2007 Baumgartner .......... H01S 5/042
372/30
2007/0153849 A1* 7/2007 Koren ..................... H01S 5/042
372/38.02

OTHER PUBLICATIONS

Interfacing Maxim Laser Drivers with Laser Diodes, Application Note: HFAN-2.0, Rev. 0, 5/00, Maxim High-Frequency/Fiber Communications Group, hfan2_v8.doc Sep. 1, 2000, 14 pages—English.

* cited by examiner

Primary Examiner — Yuanda Zhang
(74) Attorney, Agent, or Firm — Andrew F. Young, Esq.; Lackenbach Siegel, LLP

(57) ABSTRACT

The semiconductor laser driving circuit that controls an overshoot on modulation includes a semiconductor laser, of which anode is connected to a power source, that emits the laser light that is modulated by an external modulation input signal, an impedance element connected to a cathode of the laser device, an impedance element connected to the anode, and a collector of a transistor Q1, connected to the impedance element; a collector of a transistor Q2, connected to the other end of the impedance element, a differential pair circuit to which emitters of Q1, Q2 are connected; an electric current source iMOD connected to the emitters of Q1, Q2; and a differential driver that generates a differential voltage (vb1–vb2) that controls Q1, Q2 by driving Q1 by the external modulation input signal, wherein the differential driver controls the differential voltage so that the amplitude of the overshoot of the electric current, which flows in the laser when the output of the laser is at a high-level.

3 Claims, 7 Drawing Sheets

(51) Int. Cl.
*H01S 5/026* (2006.01)
*H01S 5/062* (2006.01)
*H01S 5/0683* (2006.01)

(52) U.S. Cl.
CPC ...... *H01S 5/06203* (2013.01); *H01S 5/06808* (2013.01); *H01S 5/06835* (2013.01)

SEMICONDUCTOR LASER DRIVING CIRCUIT

CROSS REFERENCE TO RELATED APPLICATIONS

This application relates to, and claims priority from JP 2017-139633 filed Jul. 19, 2017, the entire contents of which are incorporated herein by reference.

BACKGROUND OF THE INVENTION

Field of the Invention

The present invention relates to a semiconductor laser driving circuit that modulates a laser light of a semiconductor laser by an external modulation input signal.

Description of the Related Art

With respect to a medical instrumentation and an analytical measurement instrumentation that are using the laser light, the light intensity of the laser light is modulated into high-speed on an application thereof. A typical example, in which the laser light is modulated and used, is an optical communication. The optical communication uses a variety of custom driving ICs (Integrated Circuits).

The waveband for the optical communication is in the infrared region represented by 1.55 μm and the IC is optimized to the semiconductor laser of such wavelength range. In such case, a semiconductor laser driving circuit is applied to drive the optical communication semiconductor laser.

FIG. 7 is illustrating an example of the conventional semiconductor laser driving circuit (Non-patent Document 1). Referring to FIG. 7, the laser driver 50 comprises transistors Q1, Q2 constituting a differential pair and electric current sources IMOD, IBIAS.

A voltage is applied to the base of the transistor Q1, so that electric current flows to the transistor Q1 from the 3.3V power source through the resistance R1. A voltage is applied to the base of the transistor Q2, so that electric current flows to the transistor Q2 from the 3.3V power source through the semiconductor laser LD and the resistance RD. A total amount of the electric current of the transistor Q1 and the electric current of the transistor Q2 is the electric current of the electric current source IMOD. The laser light is emitted from the semiconductor laser LD based on the electric current flowing in the transistor Q2.

In addition, even when the electric current does not flow in the transistor Q2, the electric current of the electric current source IBAS flows through the reactor LS from the semiconductor laser LD.

Recently, the wavelength of the semiconductor laser expands into the visible light region to be usable for a variety of applications.

RELATED PRIOR ART DOCUMENTS

Non-Patent Document 1: Interfacing Maxim Laser Drivers with Laser Diodes, Application Note: HFAN-2.0 Rev0; 5/00, the entire contents of which are incorporated herein by reference.

ASPECTS AND SUMMARY OF THE INVENTION

Objects to be Solved

However, the semiconductor laser having a short-wavelength among the gallium nitride type visible light semiconductor lasers provides much different levels of voltage and electric current from the infrared region semiconductor laser. Therefore, when the semiconductor laser driving circuit applied to the optical communication is applied as-is, the following objects remain to be solved.

First, the forward voltage of the semiconductor laser is designed based on the infrared semiconductor laser, so that the forward voltage can be higher, and the headroom can be insufficient when the gallium nitride type semiconductor laser is applied.

When the power source voltage of the semiconductor laser is increased to solve the headroom issue, the operating point in the IC shifts, so that the optimal operation can be difficult to be achieved.

In addition, when the high-output power semiconductor laser is applied, the driving electric current can be over the rating of the ICs (Integrated Circuits).

In addition, an excess overshoot may take place depending on the modulation rate when the semiconductor laser is activated. Therefore, the occurrence of an overshoot could be a problem depending on an application.

In addition, a bias electric current needs to flow so that the overshoot on modulating can be prevented. Regardless, the optimal bias point varies with time, so that it could be a problem with that the application requires an extinction-ratio on laser-OFF.

The purpose of the present invention is to provide a semiconductor laser driving circuit that prevents the overshoot on modulating.

Means for Solving the Problem

To solve the above problem, a semiconductor laser driving circuit according to the present invention comprises a semiconductor laser, of which a first electrode is connected to a power source, that emits a laser light that an external modulation input signal modulates, a first impedance element of which one end is connected to a second electrode of the semiconductor laser, a second impedance element of which one end is connected to the first electrode of the semiconductor laser and the power source, a differential pair circuit, wherein the first main electrode of the transistor is connected to the other end of the first impedance element, the first main electrode of the second transistor is connected to the other end of the second impedance element, and the second main electrode of the first transistor and the second main electrode of the second transistor are connected thereto, and further comprises, a power source of which the one end of is connected to the second main electrode of the first transistor and the second main electrode of the second transistor, a differential driver that drives the first transistor based on the external modulation input signal and generates a differential voltage that controls the first transistor and the second transistor, wherein the differential driver controls the differential voltage so that an amplitude of an overshoot of an electric current that flows in the semiconductor laser is not larger than a predetermined value when the output of the semiconductor laser is in a high-level due to the external modulation output signal.

Effect of the Invention

According to the aspect of the present invention, the differential driver controls the differential voltage so that an amplitude of an overshoot of an electric current that flows in the semiconductor laser is not larger than a predetermined value when the output of the semiconductor laser is in a high-level due to the external modulation output signal, so that the overshoot on modulating can be prevented. In addition, no bias electric current is needed, so that a sufficient extinction-ratio can be ensured.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
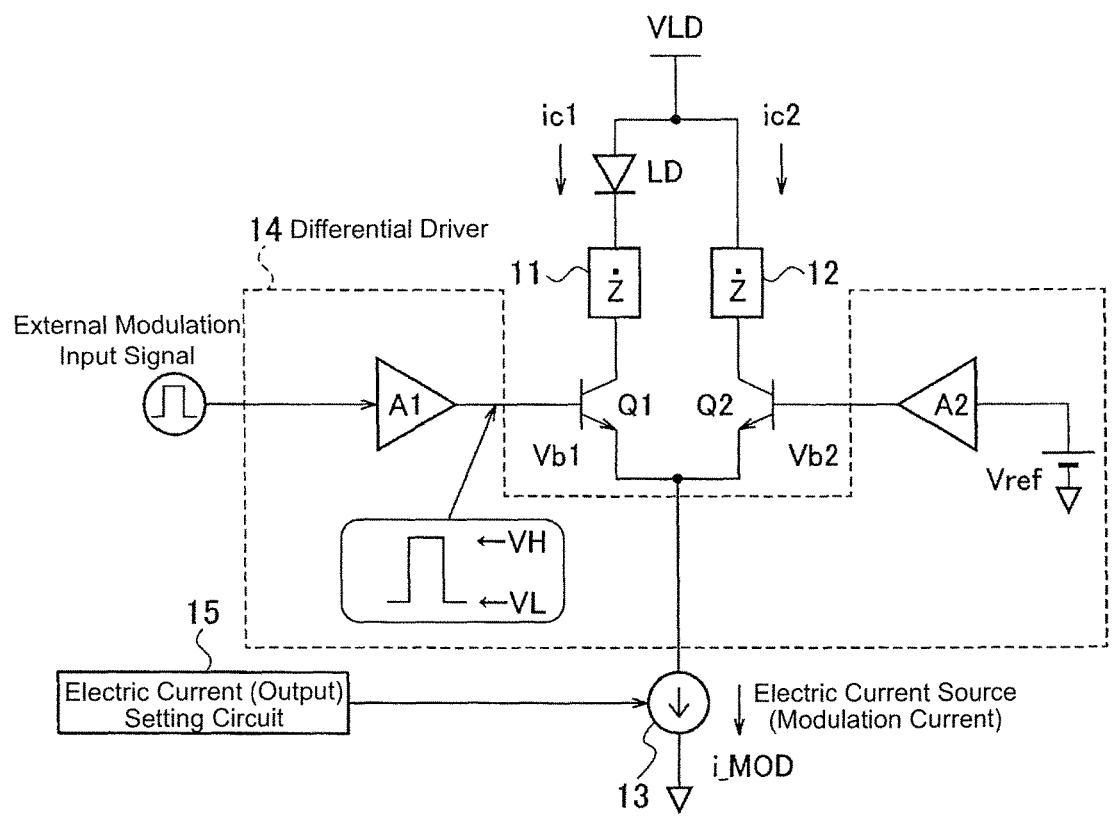
FIG. 1 is a diagram illustrating a structure of the semiconductor laser driving circuit according to the aspect of the Embodiment 1 of the present invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Those of skill in the art have great skill, having advanced training understand all the conventionally known circuits, elements, and arrangements and understand that any circuit, element, or related computational type system includes an input device for receiving data (of any type), an output device for outputting data in any tangible form (e.g. single, data, display, light, etc., any suitable memory for storing data as well as computer code, and for executing the same.

It will be further understood by those of skill in the art that the apparatus and devices and the elements or circuits herein, without limitation, and including any sub components such as operational structures, circuits, elements, devices, communication pathways, and related elements, control elements of all kinds, display circuits, calculation elements, determination elements, and control systems and elements, any necessary driving elements, inputs, sensors, detectors, pathways, memory elements, processors and any combinations of these structures etc. as will be understood by those of skill in the art as also being fully enabling and sufficiently identified as or capable of operating the systems and devices and subcomponents noted herein and structures that accomplish the functions without restrictive language or label requirements since those of skill in the art are well versed in related semiconductor laser driving circuit(s) or devices, systems, elements, or other descriptors, and operational controls and technologies of laser type circuit devices and all their sub components, including various circuits and combinations of circuits without departing from the scope and spirit of the present invention.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Embodiment 1

Hereinafter, referring to FIGs., the inventors set forth further detail of a semiconductor laser driving circuit according to the aspect of the Embodiment of the present invention.

The semiconductor laser driving circuit comprises the semiconductor laser LD, the impedance elements 11, 12, the bipolar transistors Q1, Q2, the differential driver 14 and the electric current setting circuit 15.

The semiconductor laser LD is made of a laser diode and an anode (first electrode) connects with a power source VLD. The semiconductor laser LD outputs a laser light, and an external modulation input signal modulates such laser light.

The one end of the impedance element 11 (first impedance element) is connected to a cathode (second electrode) of the semiconductor laser LD.

The one end of the impedance element 12 (second impedance element) is connected to the anode of the semiconductor laser LD and the power source VLD.

The collector (first main electrode) of the bipolar transistor (first transistor) Q1 is connected to the other end of the impedance element 11. The collector (first main electrode) of the bipolar transistor (second transistor) Q2 is connected to the other end of the impedance element 12.

The emitter (second main electrode) of the bipolar transistor Q1 and the emitter (second main electrode) of the bipolar transistor Q2 are connected to one another. The bipolar transistor Q1 and the bipolar transistor Q2 constitute the differential pair circuit.

In addition, according to the aspect of the Embodiment, the differential pair is set forth based on the bipolar transistors Q1, Q2, but instead, Q1, Q2 can be FET (field-effect transistor).

The emitter of the bipolar transistor Q1 and the emitter of the bipolar transistor Q2 are connected to the electric current source 13. The electric current setting circuit 15 sets up the electric current of the electric current source 13.

The differential driver 14 comprises an amplifier A1 and an amplifier A2 and generates a differential voltage to control the bipolar transistor and Q1 and the bipolar transistor Q2. The differential voltage is the difference voltage (vb1−vb2) between the base voltage vb1 applied to the base of the bipolar transistor Q1 and the base voltage vb2 applied to the base of the bipolar transistor Q2.

The amplifier A1 drives the bipolar transistor Q1 based on the external modulation input signal. The amplifier A2 adds the voltage, which is amplified from the reference voltage of the reference power source Vref, to the based on the bipolar transistor Q2.

The differential driver 14 controls the differential voltage (vb1−vb2) so that the amplitude of the overshoot of the electric current that flows in the semiconductor laser LD is not larger than the predetermined value when the output of the semiconductor laser LD is in the high-level due to the external modulation output signal.

Figure 2:
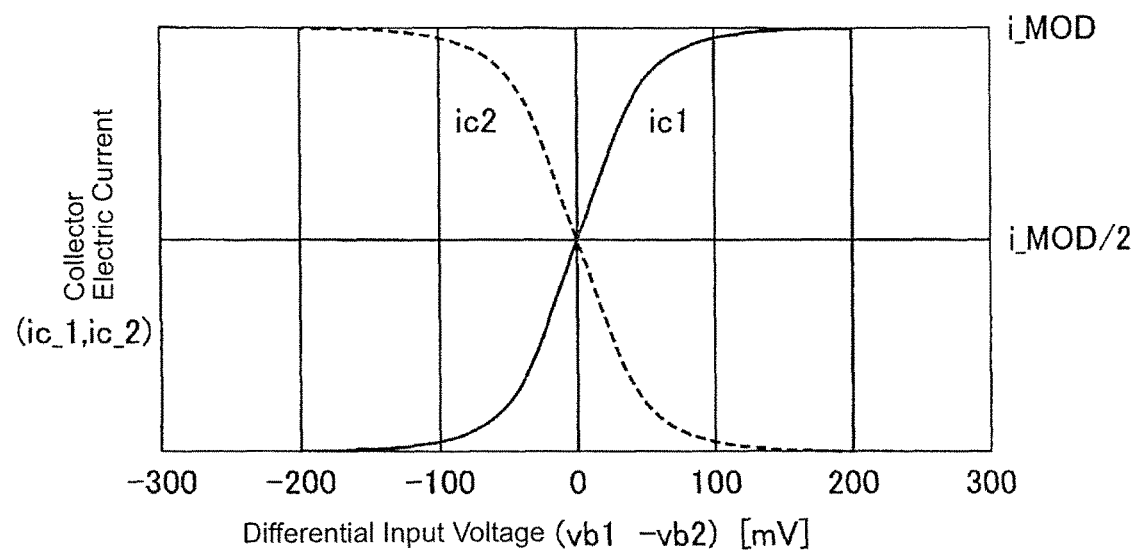
FIG. 2 is a diagram illustrating a relationship between the semiconductor laser driving circuit and the collector current according to the aspect of the Embodiment 1 of the present invention.

FIG. 2 is a diagram illustrating a relationship between the differential voltage of the semiconductor laser driving circuit and the collector current according to the aspect of the Embodiment 1 of the present invention. The horizontal axis denotes the differential voltage (vb1−vb2) and the vertical axis denotes the collector current ic1 of the bipolar transistor Q1 and the collector current ic2 of the bipolar transistor Q2.

When the differential voltage (vb1−vb2) is zero, the collector current ic1 of the bipolar transistor Q1 and the collector current ic2 of the bipolar transistor Q2 are equal each other and such current is a half electric current iMOD/2 of the electric current of the electric source iMOD.

When the differential voltage (vb1−vb2) is a negative voltage, e.g., −100 mV, −200 mV, the collector current ic1 of the bipolar transistor Q1 is smaller and the collector current ic2 of the bipolar transistor Q2 is larger.

When the differential voltage (vb1−vb2) is a positive voltage, e.g., 100 mV, 200 mV, the collector current ic1 of the bipolar transistor Q1 is larger and the collector current ic2 of the bipolar transistor Q2 is smaller.

Given the differential voltage (vb1−vb2) is higher than 125 mV, the electric current that flows in the bipolar transistor Q1 gets asymptotically closer to the electric current of the electric current source iMOD, so that the output of the semiconductor laser LD is in the high-level.

The differential driver 14 sets the differential voltage to be 120 mV-250 mV between the base voltage of the bipolar transistor Q1 and the base voltage of the bipolar transistor Q2 when the output of the semiconductor laser LD is in the high-level.

Figure 6:
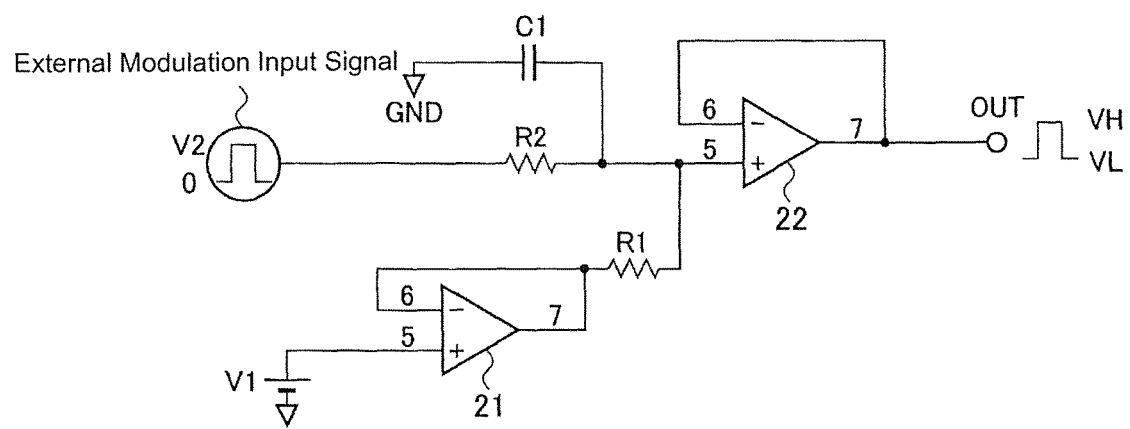
FIG. 6 is a diagram illustrating an inside structure of the amplifier semiconductor laser driving circuit installed to the semiconductor laser driving circuit according to the aspect of the Embodiment 1 of the present invention.
Figure 7:
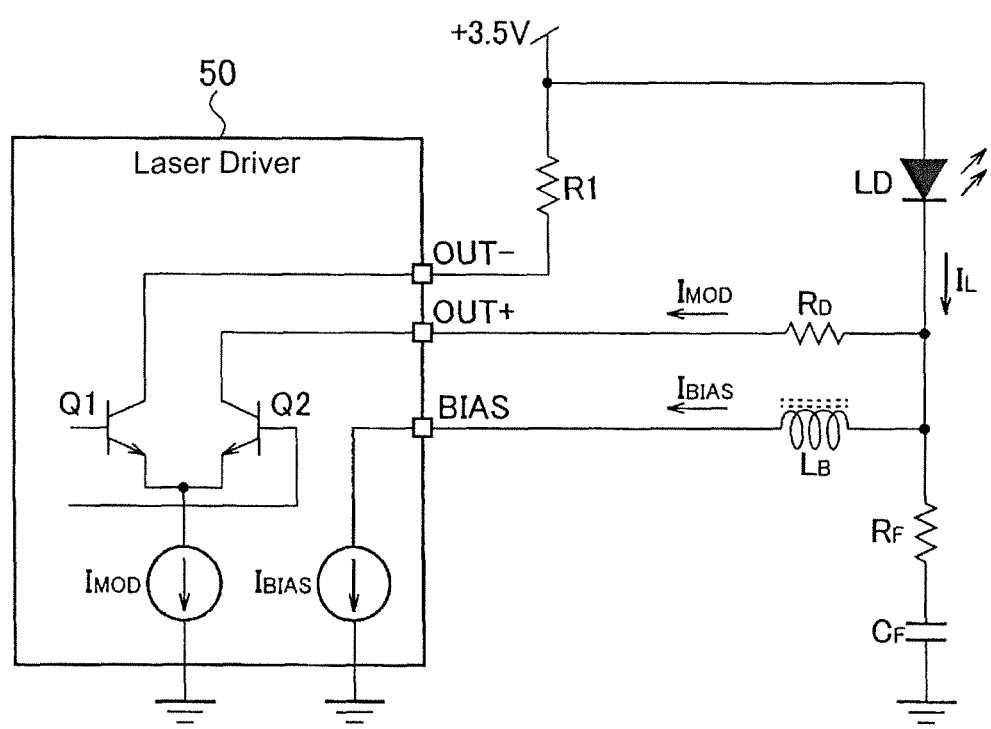
FIG. 7 is illustrating an example of the conventional semiconductor laser driving circuit.

The amplifier A1 is a circuit that generates a voltage vb1 that is applied to the base of the bipolar transistor Q1 and the amplifier A2 is a circuit that generates a voltage vb2 that is applied to the base of the bipolar transistor Q2. FIG. 6 is illustrating the detail structure of the amplifier A1.

The amplifier A1 comprises amplifiers 21, 22, a condenser C1 and the resistances R1, R2. The positive terminal of the voltage V1 of the reference power source connects with the non-inverted input terminal (+) of the amplifier 21 and the non-inverted input terminal (−) of the amplifier 21 connects with the output terminal of the amplifier 21 and the one end of the resistance R1. The other end of the resistance R1 is connected to the non-inverted input terminal of the amplifier 22.

The voltage V2 of the external modulation input signal is input to the one end of the resistance R2. The other end of the resistance R2 is connected to the non-inverted input terminal of the amplifier 22 and the one end of the condenser C1. The other end of the condenser C1 is connected to the ground (GND).

The inverted input terminal of the amplifier 22 is connected to the output terminal OUT of the amplifier 22 and the voltage proportional to the voltage V1 and the voltage V2 is applied to the base of the bipolar transistor Q1 from the output terminal OUT.

The voltage V2 of the external modulation input signal is a pulse signal between a high-level and a low-level and the voltage V1 is a DC voltage, so that the voltage output from the output terminal OUT is also the voltage of a pulse signal.

Given the high-level of the voltage of the pulse signal is VH and the low-level thereof is VL, the following formulas (1, 2) provide the VH, VL as:

$$VH = R2 \times V1/(R1+R2) + R1 \times V2/(R1+R2) \quad (1)$$

$$VL = R2 \times V1/(R1+R2) \quad (2)$$

Next, the inventors set forth an operation of the semiconductor laser driving circuit according to the aspect of the Embodiment 1 having such structure. First, when a digital modulation signal (e.g., TTL level) is input from the outside, the differential driver 14 generates the base voltage vb1 of the bipolar transistor Q1 by the amplifier A1.

In such state, referring to FIG. 6, the amplifier A1 adjusts the pulse voltage according to the formula (1), i.e., the base voltage vb1 using the amplifiers 21, 22 and the resistances R1, R2 and the voltages V1, V2 so that the electric current flows in the side of the bipolar transistor Q1.

Accordingly, the amount of the overshoot can be adjusted.

The differential driver 14 sets the differential voltage to be in the range of 120 mV to 250 mV between the base voltage of the bipolar transistor Q1 and the base voltage of the bipolar transistor Q2 when the output of the semiconductor laser LD is in the high-level.

Accordingly, the overshoot on the digital modulation can be prevented without loss of the optical output relative to the iMOD. In addition, no bias electric current is needed, so that a sufficient extinction-ratio can be ensured.

Figure 3:
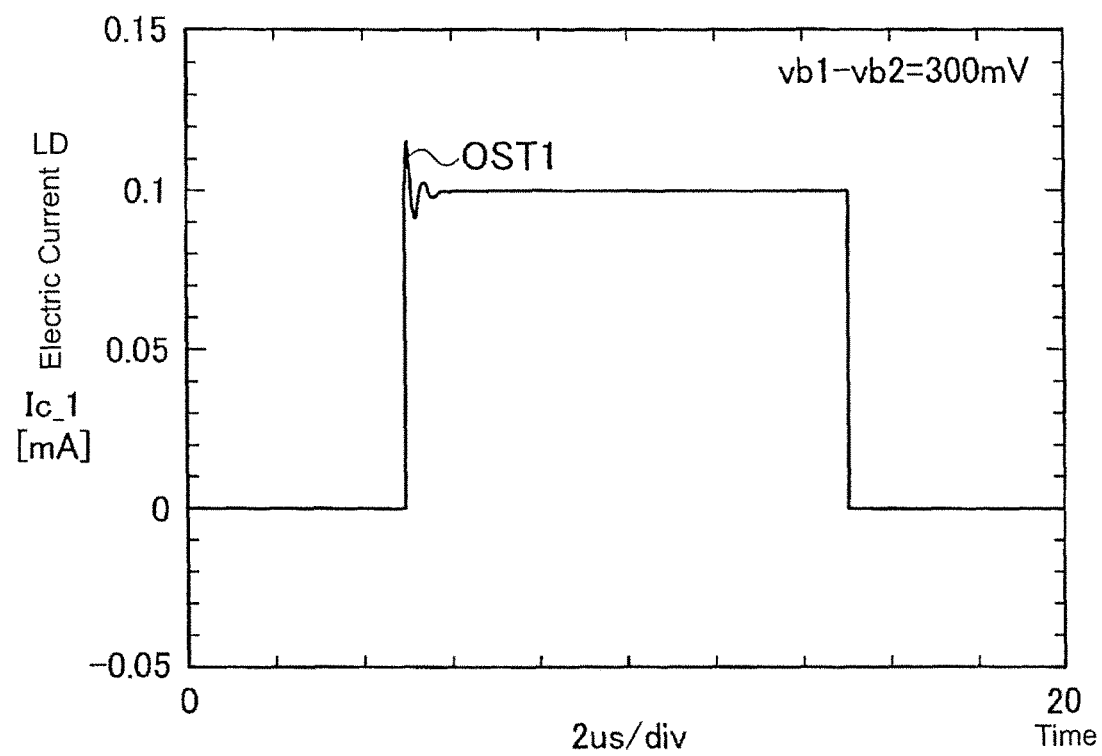
FIG. 3 is a diagram illustrating a simulation result when the differential voltage of the semiconductor laser driving circuit is 300 mV according to the aspect of the Embodiment 1 of the present invention.

FIG. 3 is illustrating the simulation result when the differential voltage of the semiconductor laser driving circuit is 300 mV according to the aspect of the Embodiment 1 of the present invention. When the differential voltage is 300 mV, the overshoot OST1 is large.

Figure 4:
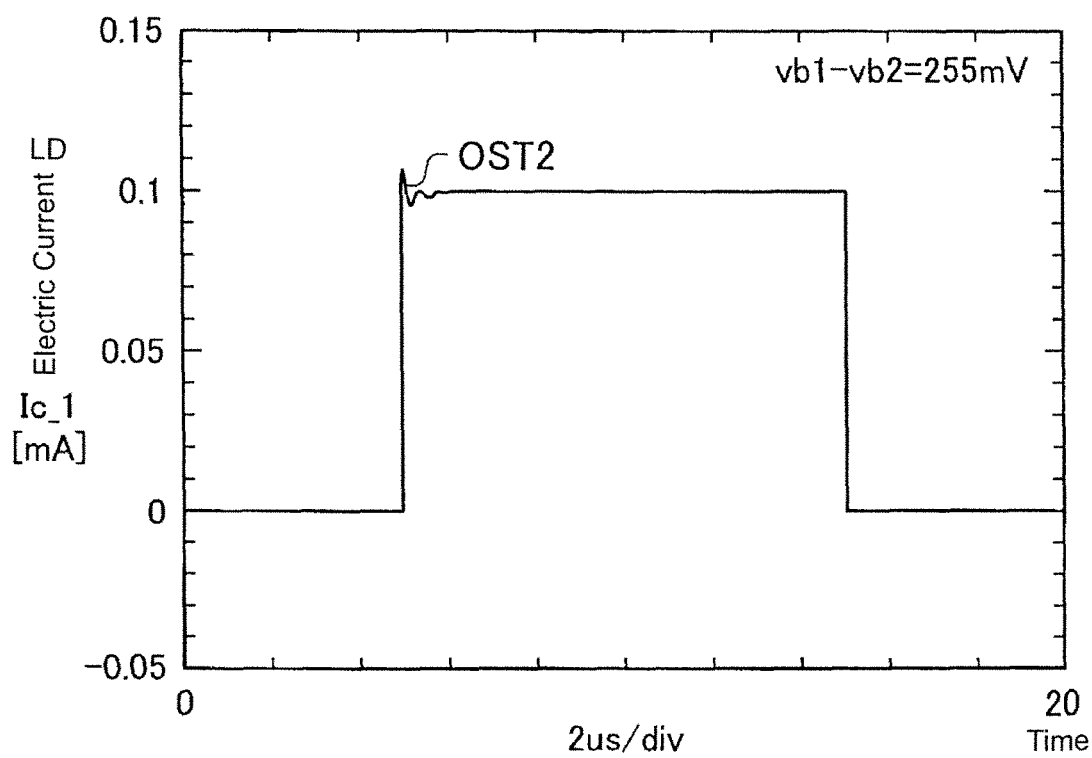
FIG. 4 is a diagram illustrating a simulation result when the differential voltage of the semiconductor laser driving circuit is 255 mV according to the aspect of the Embodiment 1 of the present invention.

FIG. 4 is illustrating the simulation result when the differential voltage of the semiconductor laser driving circuit is 255 mV according to the aspect of the Embodiment 1 of the present invention. When the differential voltage is 255 mV, the overshoot OST2 is smaller than the overshoot OST1.

Figure 5:
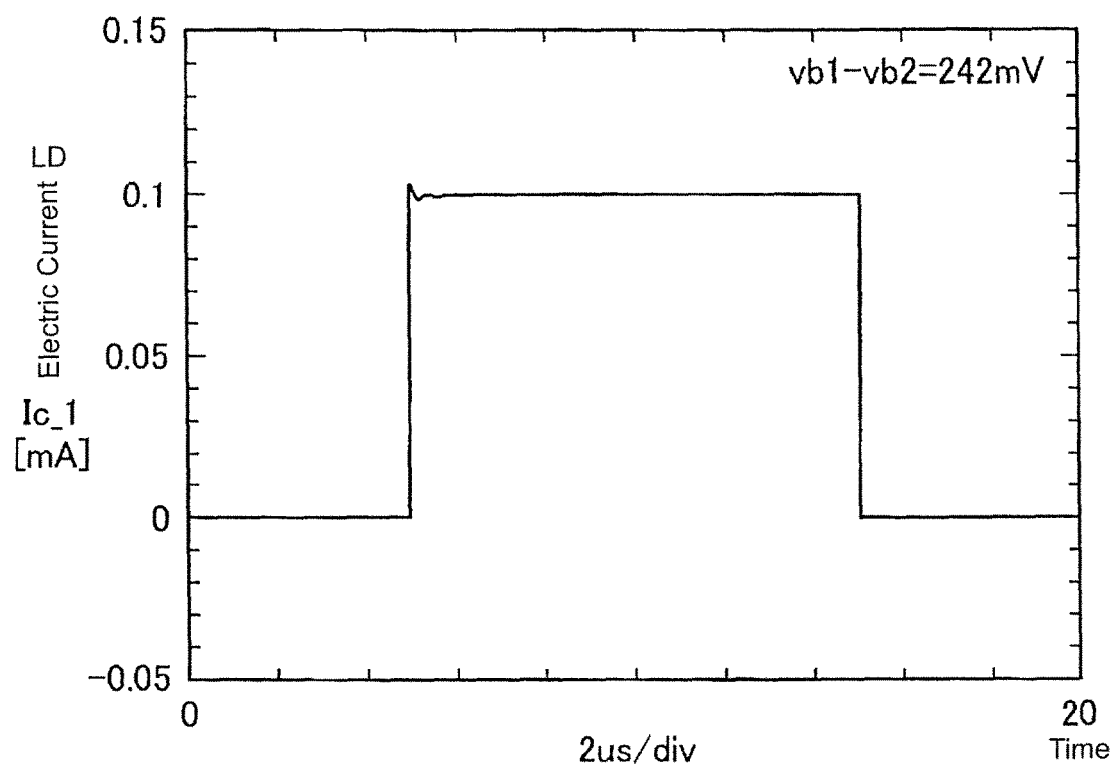
FIG. 5 is a diagram illustrating a simulation result when the differential voltage of the semiconductor laser driving circuit is 242 mV according to the aspect of the Embodiment 1 of the present invention.

FIG. 5 is a diagram illustrating a simulation result when the differential voltage of the semiconductor laser driving circuit is 242 mV according to the aspect of the Embodiment 1 of the present invention. When the differential voltage is 242 mV, the overshoot OST3 is very small.

On the other hand, when the semiconductor laser LD is OFF (extinction), the differential driver 14 is adjusted so that the differential voltage (vb1-vb2) is not higher than −125 mV, so that the electric current that flows in the bipolar transistor Q1 asymptotic to zero and therefore, the extinction ratio of the digital modulation can be sufficiently ensured.

Further, the value is adjusted when the semiconductor laser LD is not lighted, i.e., the differential voltage (vb1-vb2) is negative, so that the bias electric current can be flowed in the semiconductor laser LD within the scope in which the extinction state of the digital modulation is acceptable and as a result, the rising edge property of the digital modulation can be optimized.

INDUSTRIAL APPLICABILITY

The present invention can be applied to the laser device that the medical instrumentation and the analysis measurement instrumentation utilizing the laser light equips therewith.

REFERENCE OF SIGNS

LD Semiconductor laser
VLD Power source
Q1, Q2 Bipolar transistor
A1, A2 Amplifier
Vref Reference power source
11, 12 Impedance terminal
13 Electric current source
14 Differential driver
15 Electric current setting circuit Those of skill would further appreciate that the various illustrative logical blocks, modules, circuits, and algorithm steps described in the flow chart steps discussed herein in connection with the embodiments disclosed herein may be implemented in any suitable manner, including as electronic hardware, computer software running on a specific purpose machine that is programmed to carry out the operations described in this application, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A semiconductor laser driving circuit comprising:
a semiconductor laser that emits a laser light, wherein a first electrode thereof is connected to a power source and an external modulation input signal modulates said laser light;
a first impedance element, wherein a one end thereof is connected to a second electrode of said semiconductor laser;
a second impedance element, wherein a one end thereof is connected to said first electrode of said semiconductor laser and said power source;
a differential pair circuit, wherein a first main electrode of a first transistor is connected to the other end of said first impedance element, a first main electrode of a second transistor is connected to the other end of said second impedance element, and a second main electrode of said first transistor and a second main electrode of said second transistor are connected thereto;
a power source, wherein a one end thereof is connected to the second main electrode of said first transistor and the second main electrode of said second transistor; and
a differential driver that drives said first transistor based on said external modulation input signal and generates a differential voltage that controls said first transistor and said second transistor;
wherein said differential driver controls said differential voltage so that an amplitude of an overshoot of an electric current that flows in said semiconductor laser is not larger than a predetermined value when an output of said semiconductor laser is in a high-level due to said external modulation output signal, and wherein said differential voltage is controlled without requiring a bias electric current.

2. The semiconductor laser driving circuit, according to claim 1, wherein:
said differential driver provides said differential voltage between a voltage of said first transistor and a voltage of said second transistor that is 120 mV-250 mV when an output of said semiconductor laser is in a high-level.

3. The semiconductor laser driving circuit, according to claim 1, wherein:
said differential driver further comprises a differential amplifying circuit that adjusts a voltage that is applied to a control electrode of said first transistor so that said differential voltage is in the range of 120 mV to 250 mV.

* * * * *